(12) United States Patent
Szu et al.

(10) Patent No.: US 6,654,254 B2
(45) Date of Patent: Nov. 25, 2003

(54) PRINTED CIRCUIT BOARD ASSEMBLY HAVING RETENTION MODULE AND BACK PLATE

(75) Inventors: Ming-Lun Szu, Tu-Chen (TW); Sen-Jong Chen, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/192,108

(22) Filed: Jul. 9, 2002

(65) Prior Publication Data

US 2003/0161119 A1 Aug. 28, 2003

(30) Foreign Application Priority Data

Feb. 22, 2002 (TW) ...................................... 91202103 U

(51) Int. Cl.[7] ................................................. H05K 7/10
(52) U.S. Cl. ....................... 361/760; 361/695; 361/719; 257/719; 24/458
(58) Field of Search ................................ 361/760, 695, 361/697, 719, 759, 740, 732, 726, 747, 754; 257/719; 24/458

(56) References Cited

U.S. PATENT DOCUMENTS

| | | | |
|---|---|---|---|
| 5,662,163 A | * 9/1997 | Mira | 165/80.3 |
| 5,745,346 A | * 4/1998 | Ogawa et al. | 361/769 |
| 6,244,875 B1 | * 6/2001 | McHugh et al. | 439/73 |
| 6,442,045 B1 | * 8/2002 | Goodwin et al. | 361/816 |
| 6,466,443 B1 | * 10/2002 | Chen | 361/695 |

* cited by examiner

Primary Examiner—David Martin
Assistant Examiner—Hung Bui
(74) Attorney, Agent, or Firm—Wei Te Chung

(57) ABSTRACT

A printed circuit board assembly includes a printed circuit board (10), a retention module (20) mounted on the printed circuit board, and a back plate (30) attached to an underside of the printed circuit board opposite the retention module. The printed circuit board defines a plurality of through holes (16). The retention module defines a plurality of countersunk holes (25) therein, corresponding to the through holes of the printed circuit board. The back plate includes a base (32), and a plurality of latching posts (34) extending upwardly from the base. The latching posts extend through the through holes of the printed circuit board and engage in the countersunk holes of the retention module, thereby fixing the retention module to the printed circuit board. A plurality of fasteners (40) engages in the latching posts, thereby facilitating resilient engagement of the latching posts in the countersunk holes of the retention module.

21 Claims, 5 Drawing Sheets

PRINTED CIRCUIT BOARD ASSEMBLY HAVING RETENTION MODULE AND BACK PLATE

BACKGROUND OF THE INVENTION

1. Field of the Invention

The present invention relates to printed circuit board (PCB) assemblies, and particularly to a PCB assembly having a retention module and a back plate for fixing the retention module.

2. Prior Art

Developments in computer chip technology have given computers central processing units (CPUs) with more functions and faster processing speeds. Correspondingly, modern CPUs generate copious amounts of heat. Excessive heat can adversely affect operation of the computer system, and cause the system to become unstable. Therefore, a thermal module is widely used to remove heat from a CPU of a computer.

Referring to FIGS. 4–5, a conventional electronic device assembly includes a PCB 1, a CPU 2, a thermal module 3, a back plate 4, and a plurality of bolts 5 and nuts 6. The CPU 2 is mounted on the PCB 1, and the thermal module 3 is placed in thermal contact with the CPU 2. The back plate 4 is attached to an underside of the PCB 1, to reduce deformation of the PCB 1. The bolts 5 are respectively extended through the thermal module 3, the PCB 1 and the back plate 4, and respectively threadedly engaged with the nuts 6. The electronic device assembly is thus fixed together.

However, it is unduly troublesome and time-consuming to attach the thermal module 3 to the PCB 1 with the bolts 5 and nuts 6.

SUMMARY OF THE INVENTION

Accordingly, an object of the present invention is to provide a printed circuit board assembly having a retention module for readily receiving a thermal module therein, and having a back plate readily fixing the retention module to a PCB.

To achieve the above-mentioned object, a printed circuit board assembly includes a printed circuit board, a retention module mounted on the printed circuit board, and a back plate attached to an underside of the printed circuit board opposite the retention module. The printed circuit board defines a plurality of through holes. The retention module defines a plurality of countersunk holes therein, corresponding to the through holes of the printed circuit board. The back plate includes a base, and a plurality of latching posts extending upwardly from the base. The latching posts extend through the through holes of the printed circuit board and engage in the countersunk holes of the retention module, thereby fixing the retention module to the printed circuit board. A plurality of fasteners engages in the latching posts, thereby facilitating resilient engagement of the latching posts in the countersunk holes of the retention module.

Other objects, advantages and novel features of the present invention will be drawn from the following detailed description of a preferred embodiment of the present invention with attached drawings, in which:

DETAILED DESCRIPTION OF THE PREFERRED EMBODIMENT

Figure 1:
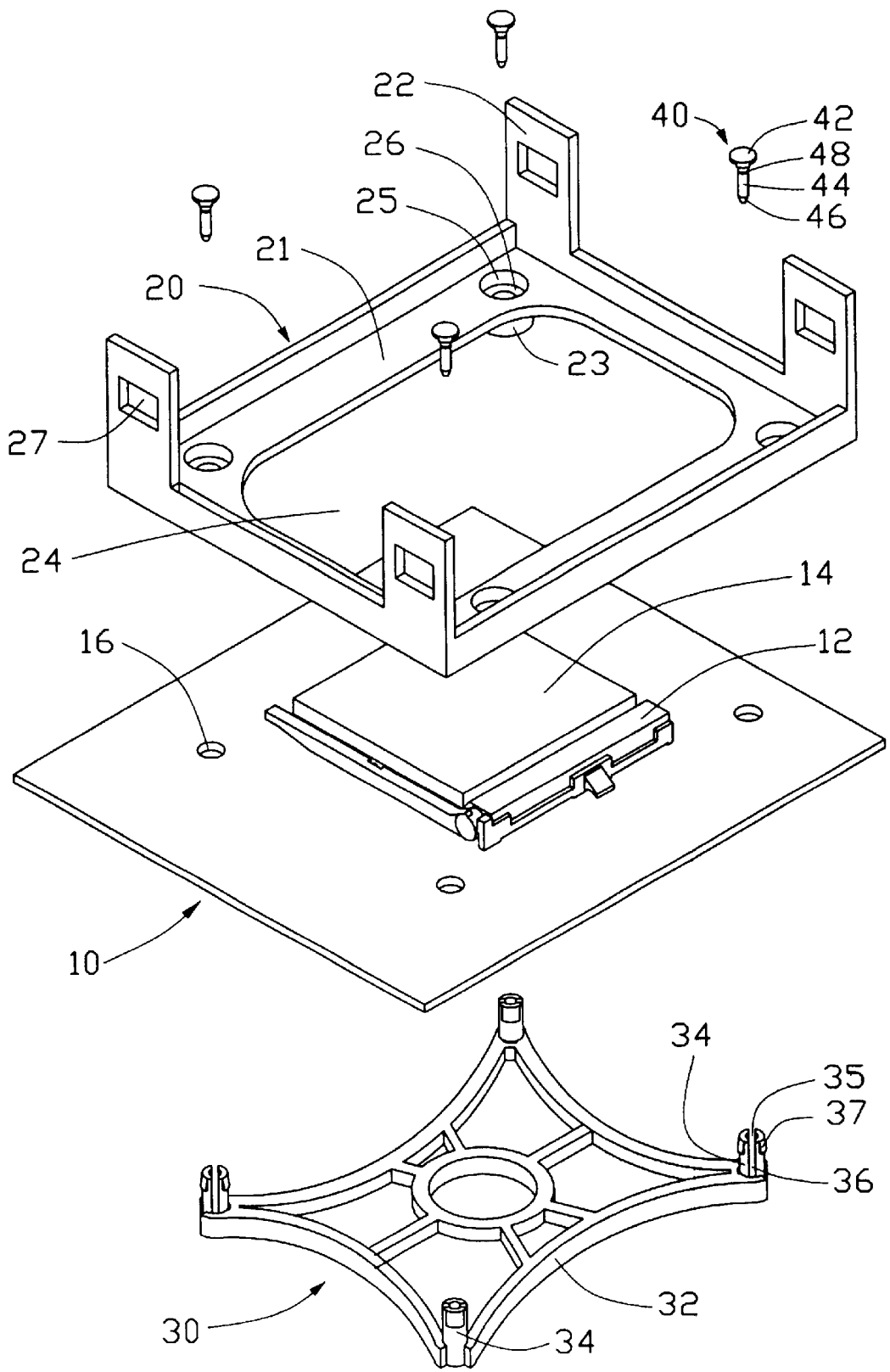
FIG. 1 is an exploded perspective view of a printed circuit board assembly in accordance with a preferred embodiment of the present invention.

Referring to FIG. 1, a printed circuit board (PCB) assembly in accordance with the present invention includes a PCB 10, a retention module 20, a back plate 30 and four fasteners 40. A socket 12 is mounted on the PCB 10. A CPU 14 is connected to the socket 12. Four through holes 16 are defined in the PCB 10 around the socket 12.

The retention module 20 includes a housing 21 for carrying a thermal module (not shown) thereon, four arms 22 upwardly extending from four corners of the housing 21 respectively, and four standoffs 23 depending from the housing 21 adjacent the four corners of the housing 21 respectively. An opening 24 is defined in a middle of the housing 21, for extension of the CPU 14 therethrough. Each standoff 26 and the housing 21 cooperatively define a countersunk hole 25 therethrough. A circular shoulder 26 is thereby formed in the housing 21 at each countersunk hole 25. Each arm 22 defines a securing hole 27 in an upper portion thereof, for fixing the thermal module to the retention module 20.

The back plate 30 includes a base 32, and four latching posts 34 extending from four corners of the base 32 respectively. Each post 34 and the base 32 cooperatively define a through aperture 35 therethrough. Each post 34 defines a pair of opposing cutouts 36. The cutouts 36 are in communication with respective opposite lateral extremities of the through aperture 35, thereby effectively splitting the post 34 into two resiliently deformable portions. Each said portion of the post 34 forms a semi-annular and slanted latching protrusion 37 on an outer surface thereof, and a semi-annular fixing protrusion 38 (see FIG. 3) on an inner surface thereof.

Figure 3:
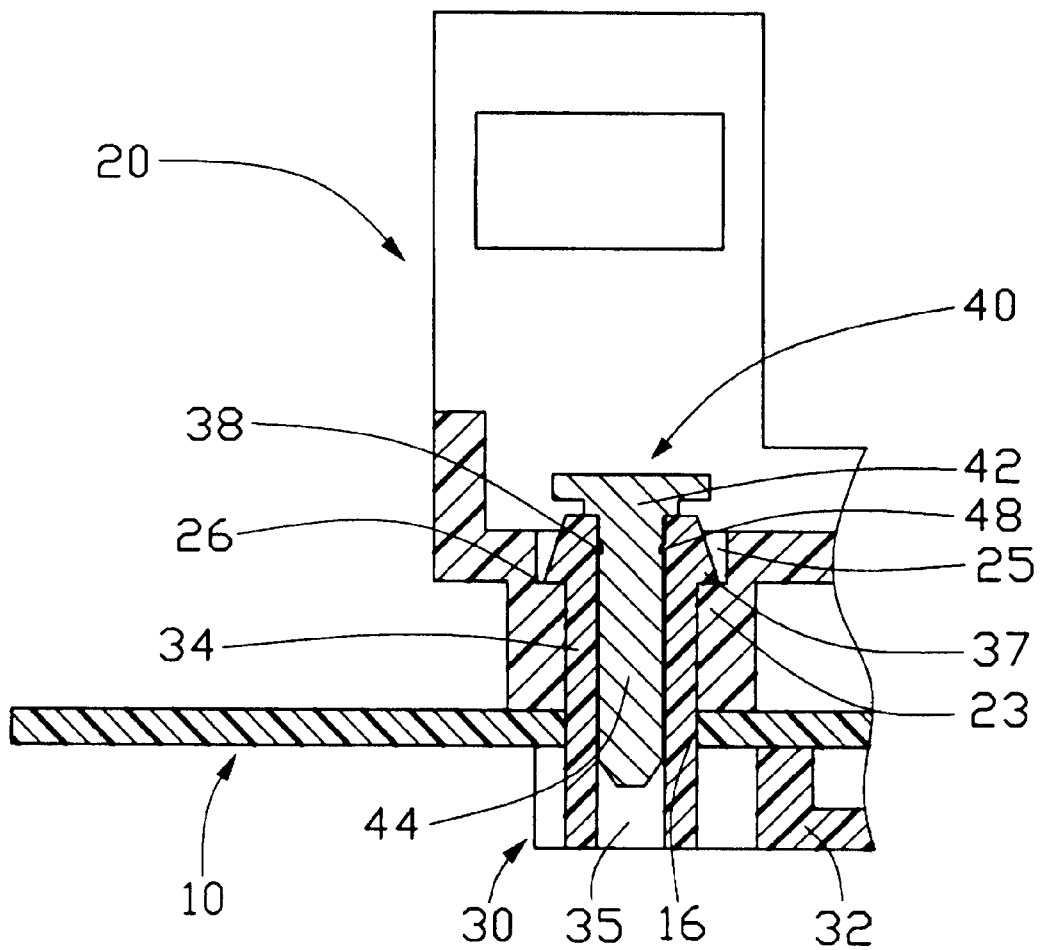
FIG. 3 is a partial cross-sectional view of FIG. 2, taken along line III—III of FIG. 2.
Figure 4:
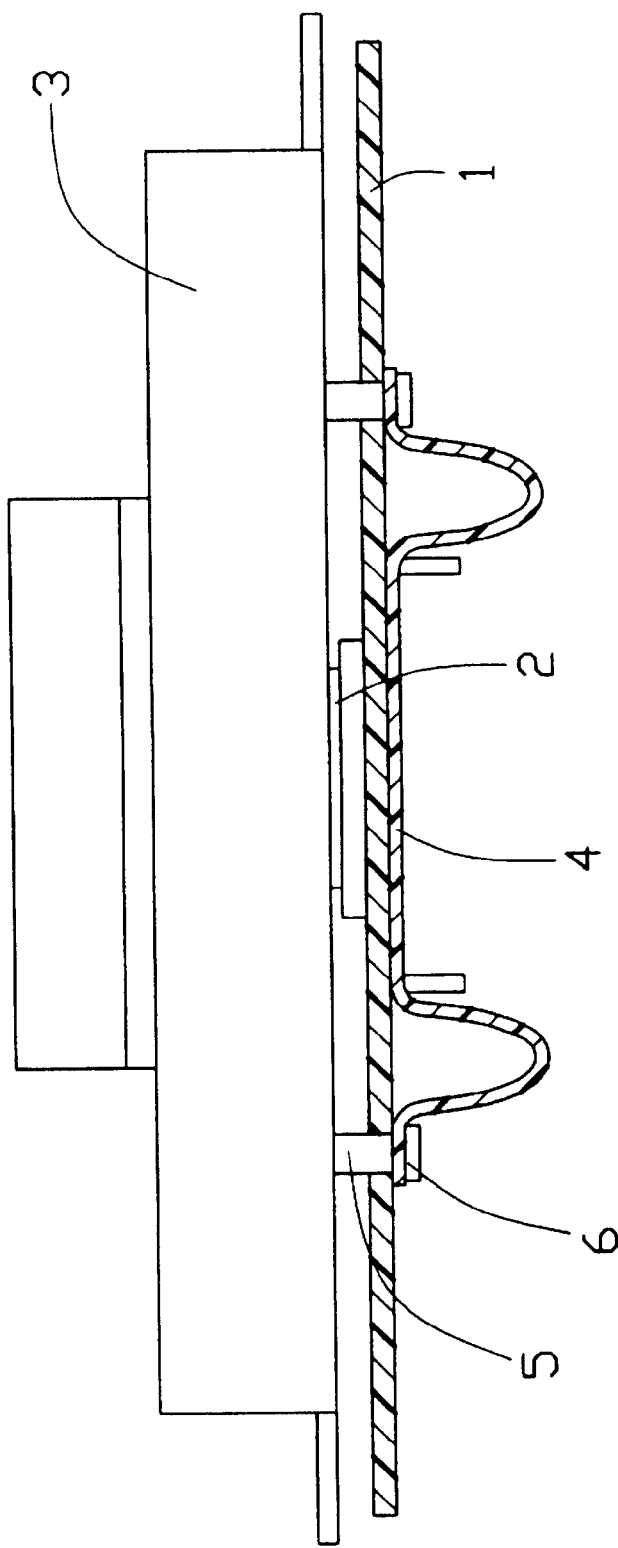
FIG. 4 is a schematic and partially cross-sectional side plan view of a conventional electronic device assembly.
Figure 5:
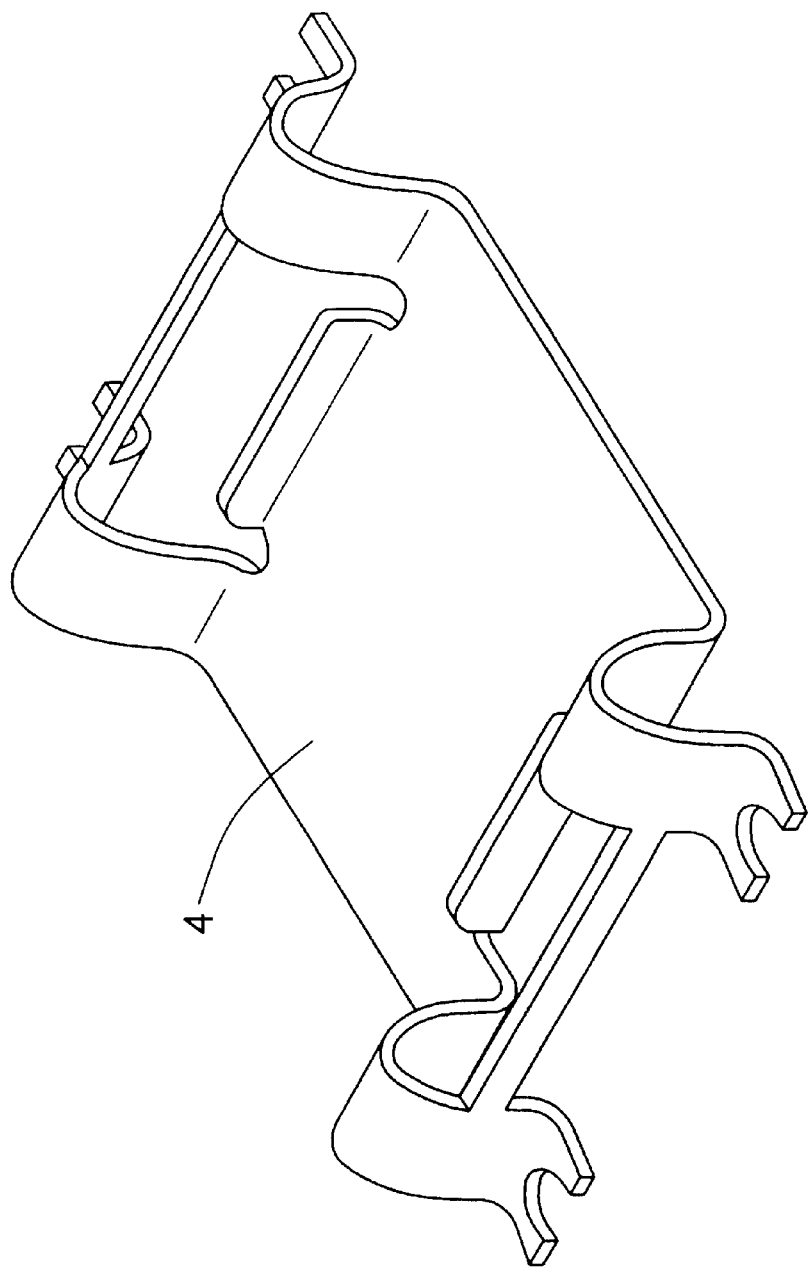
FIG. 5 is an enlarged perspective view of a back plate of the electronic device assembly of FIG. 4, viewed from a bottom aspect.

Also referring to FIG. 3, each of the fasteners 40 includes a head portion 42, a pin portion 44 depending from the head portion 42, and a guiding portion 46 depending from the pin portion 44. An annular recess 48 is defined in the pin portion 44 near the head portion 42.

Figure 2:
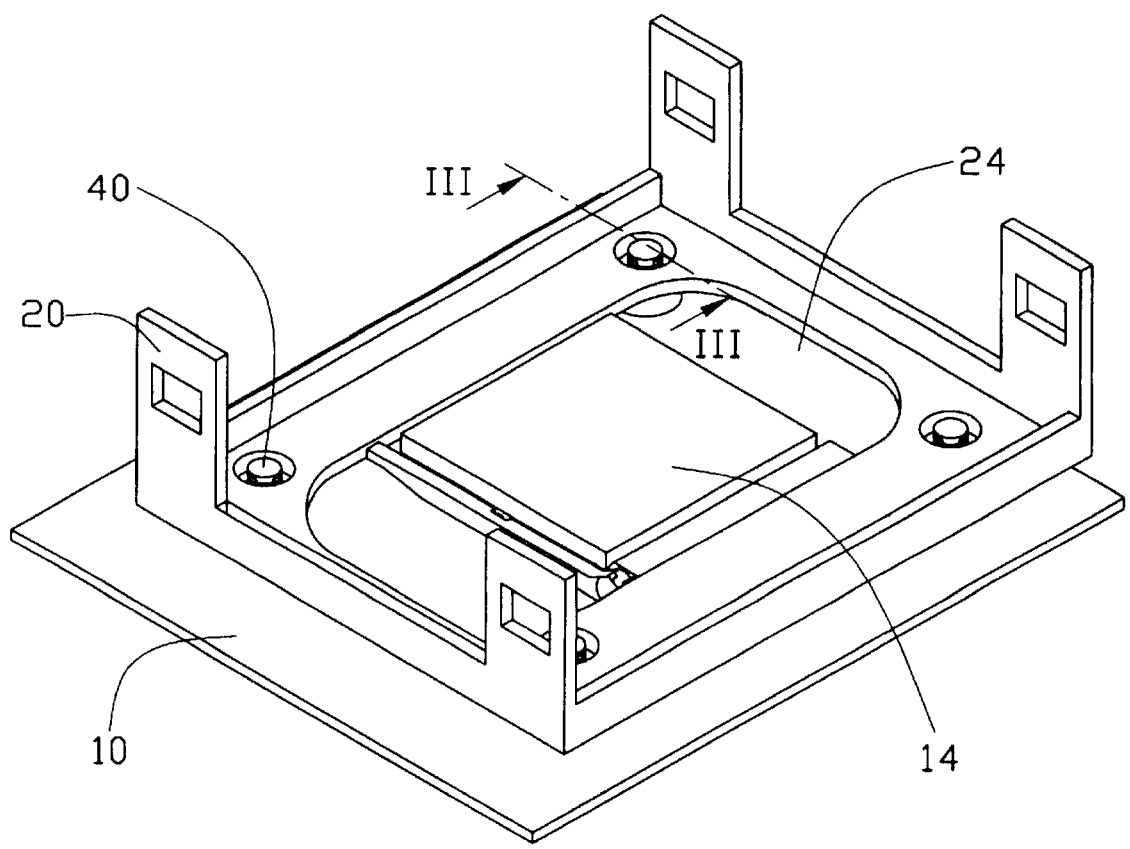
FIG. 2 is an assembled view of FIG. 1.

Referring to FIGS. 2 and 3, in assembly, the retention module 20 is placed on the PCB 10. The standoffs 23 of the retention module 20 abut against the PCB 10, with the opening 24 receiving the CPU 14 therein. The posts 34 of the back plate 30 are extended through the through holes 16 of the PCB 10, and are received in the countersunk holes 25 of the retention module 20. The base 32 of the back plate 30 abuts against the PCB 10. The latching protrusions 37 of the posts 34 engage with the shoulders 26 of the retention module 20. The guiding portions 46 of the fasteners 40 are extended into the through apertures 35 of the posts 34. Thus the pin portions 44 of the fasteners 40 are extended into the through apertures 35 of the posts 34, thereby facilitating resilient engagement between the latching protrusions 37 of the posts 34 and the shoulders 26 of the retention module 20. The head portions 42 of the fasteners 40 abut against the posts 34. The fixing protrusions 38 of the posts 34 are received in the annular recesses 48 of the fasteners 40, thereby securing the fasteners 40 to the posts 34. Thus, the retention module 20 is readily attached to the PCB 10. The thermal module is then ready to be attached to the PCB 10.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A printed circuit board assembly comprising:
   a printed circuit board defining a plurality of through holes;
   a retention module mounted on the printed circuit board, the retention module defining a plurality of fixing holes therein corresponding to the through holes of the printed circuit board; and
   a back plate attached to an underside of the printed circuit board opposite the retention module, the back plate comprising a base and plurality of latching posts extending from the base, the latching posts extending through the through holes of the printed circuit board and having engaging means to engage in the fixing holes of the retention module thereby fixing the retention module to the printed circuit board;
   a plurality of fasteners engages with the latching posts of the back plate, thereby facilitating the engagement of the latching posts of the back plate in the fixing holes of the retention module.

2. The printed circuit board assembly as claimed in claim 1, wherein each of the latching posts of the back plate defines a through aperture, and wherein each of the fasteners comprises a pin portion received in the through aperture of corresponding latching post.

3. The printed circuit board assembly as claimed in claim 2, wherein each of the latching posts defines a pair of cutouts in communication with the through aperture, whereby each of the latching posts is effectively split into two resiliently deformable portions.

4. The printed circuit board assembly as claimed in claim 3, wherein each of said portions of the latching posts forms a latching protrusion on an outer surface thereof, the latching protrusion engaging with the retention module.

5. The printed circuit board assembly as claimed in claim 3, wherein each of said portions of the latching posts forms a fixing protrusion on an inner surface thereof, and wherein a recess is defined in the pin portion of each of the fasteners, the recess receiving the fixing protrusions of a corresponding latching post therein.

6. The printed circuit board assembly as claimed in claim 5, wherein each of the fasteners comprises a head portion abutting against a corresponding latching post of the back plate, and wherein the pin portion of each of the fasteners extends from the head portion.

7. The printed circuit board assembly as claimed in claim 1, wherein each of the fixing holes of the retention module is substantially a countersunk hole, and the engaging means of each latching post abuts against a top surface of a step in said countersunk hole.

8. The printed circuit board assembly as claimed in claim 1, wherein the retention module comprises a housing, a plurality of standoffs depending from the housing and abutting against the printed circuit board, and a plurality of arms extending upwardly from the housing for fixing a thermal module to the housing, and wherein the standoffs and the housing cooperatively define the plurality of fixing holes of the retention module.

9. A retention module assembly comprising:
   a retention module adapted for attachment to a printed circuit board, the retention module comprising a housing, a plurality of standoffs depending from the housing, and a plurality of arms extending upwardly from the housing for fixing a thermal module to the housing, each of the standoffs and the housing cooperatively defining a fixing hole therethrough; and
   a back plate adapted for attachment to an underside of the printed circuit board opposite the retention module, the back plate comprising a base and a plurality of latching posts extending from the base, the latching posts engaging in the fixing holes of the retention module when the retention module and the back plate are fixed to the printed circuit board, wherein each of the latching posts forms at least one latching protrusion at a distal end thereof, said at least one latching protrusion engages with the thermal module at a corresponding fixing hole.

10. The retention module assembly as claimed in claim 9, further comprising a plurality of fasteners engaging with the latching posts of the back plate, thereby facilitating the engagement of the latching posts of the back plate in the fixing holes of the retention module.

11. The retention module assembly as claimed in claim 10, wherein each of the latching posts of the back plate defines a through aperture, and wherein each of the fasteners comprises a pin portion received in the through aperture of a corresponding latching post.

12. The retention module assembly as claimed in claim 11, wherein each of the latching posts defines a pair of cutouts in communication with the through apse, whereby each of the latching posts is effectively split into two resiliently deformable portions.

13. The retention module assembly as claimed in claim 12, wherein each of said portions of the latching posts forms a latching protrusion on an outer surface thereof, the latching protrusion engaging with the retention module.

14. The retention module assembly as claimed in claim 12, wherein each of said portions of the latching posts forms a fixing protrusion on an inner surface thereof, and wherein a recess is defined in the pin portion of each of the fasteners, the recess receiving the fixing protrusions of a corresponding latching post therein.

15. The retention module assembly as claimed in claim 14, wherein each of the fasteners comprises a head portion abutting against a corresponding latching post of the back plate, and wherein the pin portion of each of the fasteners extends from the head portion.

16. The retention module assembly as claimed in claim 9, wherein each of the fixing holes of the retention module is substantially a countersunk hole.

17. A printed circuit board assembly comprising;
   a printed circuit board defining a plurality of through holes therein;
   an electronic component seated upon an upper surface of said printed circuit board;
   a retention module mounted on said upper surface and surrounding said electronic component; and
   a back plate positioned on an undersurface of the printed circuit board opposite to said upper surface;
   a plurality of latching posts integrally extending from one of the retention module and the back plate, through the corresponding through holes, and retainably received within corresponding fixing holes of the other of said retention module and said back plate, respectively; wherein
   said printed circuit board is sandwiched between said retention module and said back plate, and wherein at least one of the latching posts has engaging means, said engaging means engages with said other of said retention module at said corresponding fixing hole, and wherein said fixing holes are formed in corresponding standoffs respectively.

18. The assembly as claimed in claim 17, wherein each of said posts defines a central through aperture for increasing resiliency thereof.

19. The assembly as claimed in claim 18, wherein interlocking means is formed on an exterior periphery of said pin type fastener and an interior periphery of said through aperture for retaining said pin type fastener and said post together.

20. The assembly as claimed in claim 17, wherein a discrete pin type fastener downwardly extends into each of said posts for increasing retention thereof, and said fastener is generally located on the same surface of the printed circuit board with the corresponding fixing hole.

21. The assembly as claimed in claim 17, wherein said one of the retention module and the back plate is the retention module.

* * * * *